United States Patent
Herzogenrath et al.

(10) Patent No.: US 11,242,240 B2
(45) Date of Patent: Feb. 8, 2022

(54) MICROMECHANICAL SENSOR SYSTEM

(71) Applicant: Robert Bosch GmbH, Stuttgart (DE)

(72) Inventors: Benny Pekka Herzogenrath, Wuppertal (DE); Denis Gugel, Dusslingen (DE); Jan Waldmann, Reutlingen (DE); Michael Jaax, Reutlingen-Betzingen (DE); Monika Koster, Reutlingen (DE)

(73) Assignee: Robert Bosch GmbH, Stuttgart (DE)

(*) Notice: Subject to any disclaimer, the term of this patent is extended or adjusted under 35 U.S.C. 154(b) by 128 days.

(21) Appl. No.: 16/127,628

(22) Filed: Sep. 11, 2018

(65) Prior Publication Data
US 2019/0092619 A1 Mar. 28, 2019

(30) Foreign Application Priority Data
Sep. 25, 2017 (DE) .......................... 102017216962.1

(51) Int. Cl.
*B81B 3/00* (2006.01)
*G01P 15/08* (2006.01)
*B81B 7/02* (2006.01)

(52) U.S. Cl.
CPC .......... *B81B 3/0018* (2013.01); *B81B 3/0051* (2013.01); *B81B 7/02* (2013.01); *G01P 15/08* (2013.01); *G01P 15/0802* (2013.01); *B81B 2201/025* (2013.01); *G01P 2015/0837* (2013.01); *G01P 2015/0871* (2013.01)

(58) Field of Classification Search
CPC .... G01P 15/125; G01P 15/0802; G01P 15/18; G01P 2015/086; G01P 2015/084; G01P 2015/0808; G01P 2015/822; G01P 2015/0831; G01P 2015/0834; G01P 2015/0871; G01H 11/06; B81B 2201/0235; B81B 3/0051
USPC .............. 73/514.32, 514.02, 514.18, 514.23, 73/514.24
See application file for complete search history.

(56) References Cited

U.S. PATENT DOCUMENTS

| | | | |
|---|---|---|---|
| 6,737,979 B1* | 5/2004 | Smith | G08B 21/18 340/665 |
| 2003/0232512 A1* | 12/2003 | Dickinson | B08B 3/04 438/786 |
| 2006/0261032 A1* | 11/2006 | Krishnamoorthy | G02B 26/0833 216/2 |
| 2010/0007874 A1 | 1/2010 | Lunati et al. | |
| 2011/0048131 A1* | 3/2011 | Reinmuth | G01P 15/125 73/504.12 |
| 2013/0299923 A1* | 11/2013 | Classen | B81B 3/0018 257/415 |
| 2014/0069191 A1* | 3/2014 | Yu | G01P 15/125 73/514.36 |

(Continued)

FOREIGN PATENT DOCUMENTS

| | | |
|---|---|---|
| DE | 19813941 A1 | 10/1999 |
| DE | 102012207939 A1 | 11/2013 |

(Continued)

*Primary Examiner* — Robert R Raevis
(74) *Attorney, Agent, or Firm* — Norton Rose Fulbright US LLP; Gerard Messina

(57) ABSTRACT

A micromechanical sensor system that includes a mass that is deflectable at least in the z direction. A stop element having an elastic design is situated on the mass on at least one of the sides oriented in the z direction, via a connection element.

10 Claims, 5 Drawing Sheets

(56) References Cited

U.S. PATENT DOCUMENTS

| | | | |
|---|---|---|---|
| 2014/0260613 A1* | 9/2014 | Qiu | G01C 19/5733 |
| | | | 73/504.15 |
| 2014/0298910 A1* | 10/2014 | Simoni | G01P 1/00 |
| | | | 73/514.32 |
| 2016/0094156 A1 | 3/2016 | Thompson et al. | |
| 2016/0370397 A1* | 12/2016 | Lin | G01P 15/18 |
| 2019/0120872 A1* | 4/2019 | Geisberger | B81B 3/0051 |

FOREIGN PATENT DOCUMENTS

| | | |
|---|---|---|
| DE | 102016203092 A1 | 5/2017 |
| KR | 20150090629 A | 8/2015 |

\* cited by examiner

MICROMECHANICAL SENSOR SYSTEM

CROSS REFERENCE

The present application claims the benefit under 35 U.S.C. § 119 of German Patent No. DE 102017216962.1 filed on Sep. 25, 2017, which is expressly incorporated herein by reference in its entirety.

BACKGROUND INFORMATION

The present invention relates to a micromechanical sensor system that includes a mass that is deflectable at least in the z direction.

Moreover, the present invention relates to a method for manufacturing a micromechanical sensor system.

Although the present invention is generally applicable to micromechanical sensor systems, the present invention is explained with reference to micromechanical inertial sensors.

Although the present invention is generally applicable to any deflectable masses, the present invention is explained with reference to a seismic mass of a spring-mass system.

Micromechanical inertial sensors are used, among other things, as acceleration sensors or inclination sensors. In the event of mechanical overload, the seismic mass of these sensors comes into contact with fixed stop structures that limit the further movement of the seismic mass. The deflection of the seismic mass may take place in parallel with a plane of the substrate, and for acceleration sensors and rotation rate sensors may take place perpendicularly with respect to the substrate plane. In the latter case, stop structures are then situated perpendicularly with respect to the substrate plane. When a mechanical overload occurs, the seismic mass may adhere to the stop structure. In the event of an overload, the stop structures and/or the seismic mass may also deform due to the kinetic energy that is transmitted during the impact.

A micromechanical sensor system that includes a mass that is deflectable in the z direction is described in U.S. Patent Application Publication No. US 2010/007874 A1. The mass includes an additional spring element that is connected to the mass, and that is situated in the plane of the mass and deflectable in the z direction, and that is designed to provide a force opposite the deflection force of the mass.

A micromechanical sensor is described in U.S. Patent Application Publication No. US 2016/0094156 A1. The micromechanical sensor includes a spring-mass system. In addition, stops are situated on a substrate for the mass of the spring-mass system. The stops are situated on a plate-shaped flexible element, which in turn is situated on fixed bearing points.

A micromechanical sensor with a diaphragm that includes stops for a deflectable mass is described in KR 2015/0090629 A. The diaphragm together with the stops is fixedly mounted above and below the deflectable mass.

SUMMARY

In one specific embodiment, the present invention provides a micromechanical sensor system that includes a mass that is deflectable at least in the z direction, a stop element having an elastic design being situated on the mass on at least one of the sides oriented in the z direction, via a connection element.

In another specific embodiment, the present invention provides a method for manufacturing a micromechanical sensor system, a stop layer that includes the stop element and the thin layer, a connecting layer that includes the connecting structure, and the mass being produced in succession, and for each layer the following operations taking place in succession:
material for this layer is deposited,
the deposited material is structured,
a sacrificial layer is deposited on the structured material, and
the sacrificial layer is structured,
with all sacrificial layers being subsequently removed.

One of the advantages thus achieved is that a reduction in the transmitted kinetic energy in the event of an overload is made possible. Another advantage is that damage and deformation of micromechanical structures are avoided. Another advantage is that adhesion of the deflected mass to a stop structure, a substrate, or the like is avoided, or at least the likelihood of adhesion is reduced.

The term "z direction" with regard to a deflection is understood in the broadest sense, and in the claims, preferably in the description, refers to an arbitrarily oriented deflection direction.

Further features, advantages, and other specific embodiments of the present invention are described below or thereby providable.

According to one advantageous refinement, the connection element is provided in the form of a connecting layer. One of the advantages thus achieved is that the connection element is manufacturable in a simple manner.

According to another advantageous refinement, the stop element includes a thin layer, in particular made of silicon, which on its side facing away from the mass includes at least one stop. The advantage is that an efficient spring action is thus provided due to cooperation of the stop with the thin layer. In addition, attaching or mounting stops is easily possible. A thin layer is understood here to mean in particular a layer whose thickness in the z direction is significantly less than the thickness of the mass, preferably less than 25%, in particular less than 20%, in particular less than 15%, preferably only 10%, of the thickness of the mass in the z direction. The ratio of the thickness of the thin layer to the extension of the stops in the z direction is preferably between 1 and 15, in particular between 2 and 7, preferably 3. The magnitudes of the extension of the stops in the z direction and of the thickness of the thin layer are in particular between 0.25 µm and 2 µm.

According to another advantageous refinement, multiple stops are provided which have different extensions and/or different rigidities, at least in the z direction. On the one hand, a fine division of the damping of the mass is made possible by the stops, and on the other hand, due to providing multiple stops, a damping effect may be provided in an extremely flexible manner with the aid of the damping system via the arrangement or design of the stops.

According to another advantageous refinement, the stops in at least one direction along the thin layer have an increasing extension in the z direction. Stepped damping along the at least one direction may thus be provided in an extremely flexible manner.

According to another advantageous refinement, the thin layer includes at least one recess and/or at least one hole and/or at least one elevation. One of the advantages thus achieved is that the damping effect or the spring action of the thin layer may be adapted to predefined conditions in a manner that is both simple and extremely flexible.

According to another advantageous refinement, multiple recesses and/or holes are arranged in a periodic and/or symmetrical manner. The advantage is that structuring of the thin layer for flexibly setting the damping effect or the spring action may take place in a simple manner.

According to another advantageous refinement, stops having a fairly high rigidity are situated in areas of the thin layer that are joined to the connection element. Excessive bending of the thin layer is thus prevented.

According to another advantageous refinement, multiple stops are asymmetrically situated on the thin layer. With the aid of an asymmetrical arrangement, a tilting moment may be provided which further reduces the tendency of the stops to adhere to a substrate or the like in the event of an overload.

According to another advantageous refinement, the connection element has a U-shaped design and is situated on two opposite sides of the thin layer, the respective corners being rounded. The introduction of stress, torsions, or the like onto the thin layer is thus avoided with the aid of the connection element.

According to another advantageous refinement, the mass is designed as a seismic mass as part of a spring-mass system. An extremely reliable inertial sensor may be provided in this way.

According to another advantageous refinement, the structured material of at least one of the layers is restructured after structuring the particular sacrificial layer. This allows, for example, structuring of the thin layer with recesses or the like.

Further important features and advantages of the present invention result from the figures, and the associated description of the figures with reference to the figures.

It is understood that the features mentioned above as well as the features to be explained below may be used not only in the particular stated combination, but also in other combinations or alone without departing from the scope of the present invention.

Preferred embodiments and specific embodiments of the present invention are illustrated in the figures and explained in greater detail in the following description; identical reference numerals refer to identical, similar, or functionally equivalent components or elements.

DETAILED DESCRIPTION OF EXAMPLE EMBODIMENTS

Figure 1:
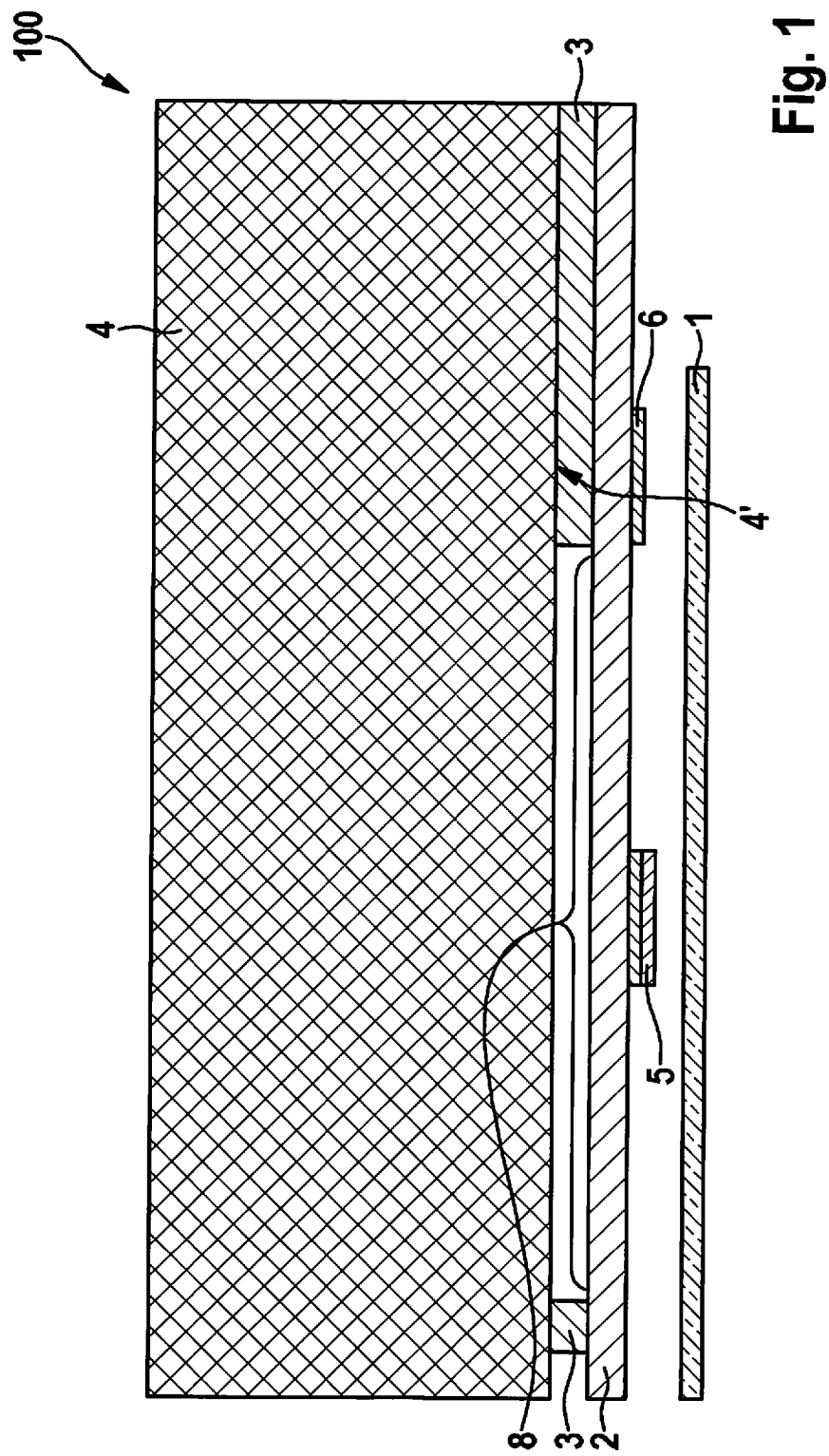
FIG. 1 shows a cross section of a micromechanical sensor system according to one specific embodiment of the present invention.

FIG. 1 shows in schematic form a cross section of a micromechanical sensor system according to one specific embodiment of the present invention.

FIG. 1 shows in detail a cross section of a micromechanical sensor system 100. Micromechanical sensor system 100 includes a seismic mass 4 that is translationally movable or deflectable in z direction 7, i.e., upwardly or downwardly in FIG. 1. Situated on portions of bottom side 4' of seismic mass 4, i.e., on one of the two sides of seismic mass 4 in the direction of a deflection in z direction 7, is a connecting layer 3 that is joined to a thin layer 2. A flexible area is situated between seismic mass 4 and thin layer 2. This area is formed by a recess 8 in connecting layer 3, between seismic mass 4 and thin layer 2. Two stops 5 and 6 are shown on the side of thin layer 2 facing away from seismic mass 4. Stop 5 has a greater thickness in z direction 7 than does second stop 6. In addition, stop 5 is farther outwardly situated, based on the midpoint of seismic mass 4 (situated in the area in the continuation of the seismic mass to the right in FIG. 1 (not shown here)), than stop 6. Seismic mass 4 as well as connecting layer 3 may be made of silicon. Seismic mass 4 and connecting layer 3 are mechanically fixedly anchored or connected to thin layer 2, which may likewise be made of silicon. The two stops 5 and 6 may be made of silicon, silicon nitride, or germanium.

If movable micromechanical sensor system 100 is now deflected in negative z direction 7 due to mechanical overload, first stop 5 initially contacts an immovable silicon, silicon nitride, copper, or aluminum layer with a substrate bond 1. Upon further deflection, thin layer 2 yields to the movement and absorbs a portion of the kinetic energy of the overload. After a certain deflection of thin layer 2 in negative z direction 7, second stop 6, which in this case has greater rigidity than first stop 5, contacts immovable silicon layer 1, and movable mass 4 of micromechanical sensor system 100 comes to a rest.

Figure 2:
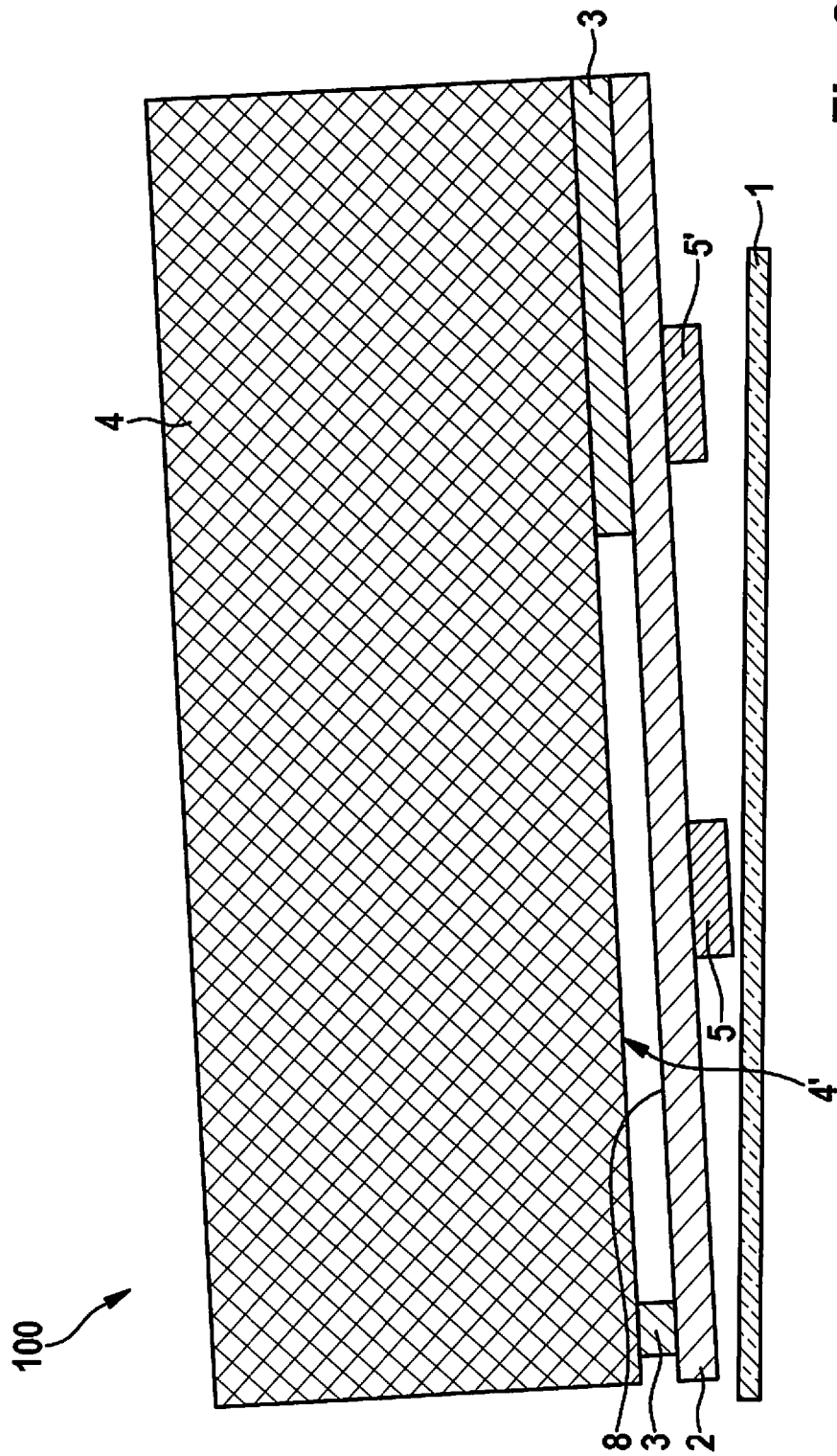
FIG. 2 shows a cross section of a micromechanical sensor system according to another specific embodiment of the present invention.

FIG. 2 shows in schematic form a cross section of a micromechanical sensor system according to another specific embodiment of the present invention.

FIG. 2 essentially shows a micromechanical sensor system 100 according to FIG. 1. In contrast to micromechanical sensor system 100 according to FIG. 1, micromechanical sensor system 100 according to FIG. 2 now has stops 5, 5' having the same design. In addition, micromechanical sensor system 100 is now designed as a z rocker; i.e., instead of a translational movement of seismic mass 4 according to FIG. 1, the seismic mass may now undergo a rotatory movement. The second stop having greater rigidity, denoted by reference numeral 6 in FIG. 1, may thus be dispensed with here. In FIG. 2, two stops 5, 5' having the same design are provided which on the one hand have the same extension in the z direction, and on the other hand are also made of the same material or from the same layer.

Figure 3:
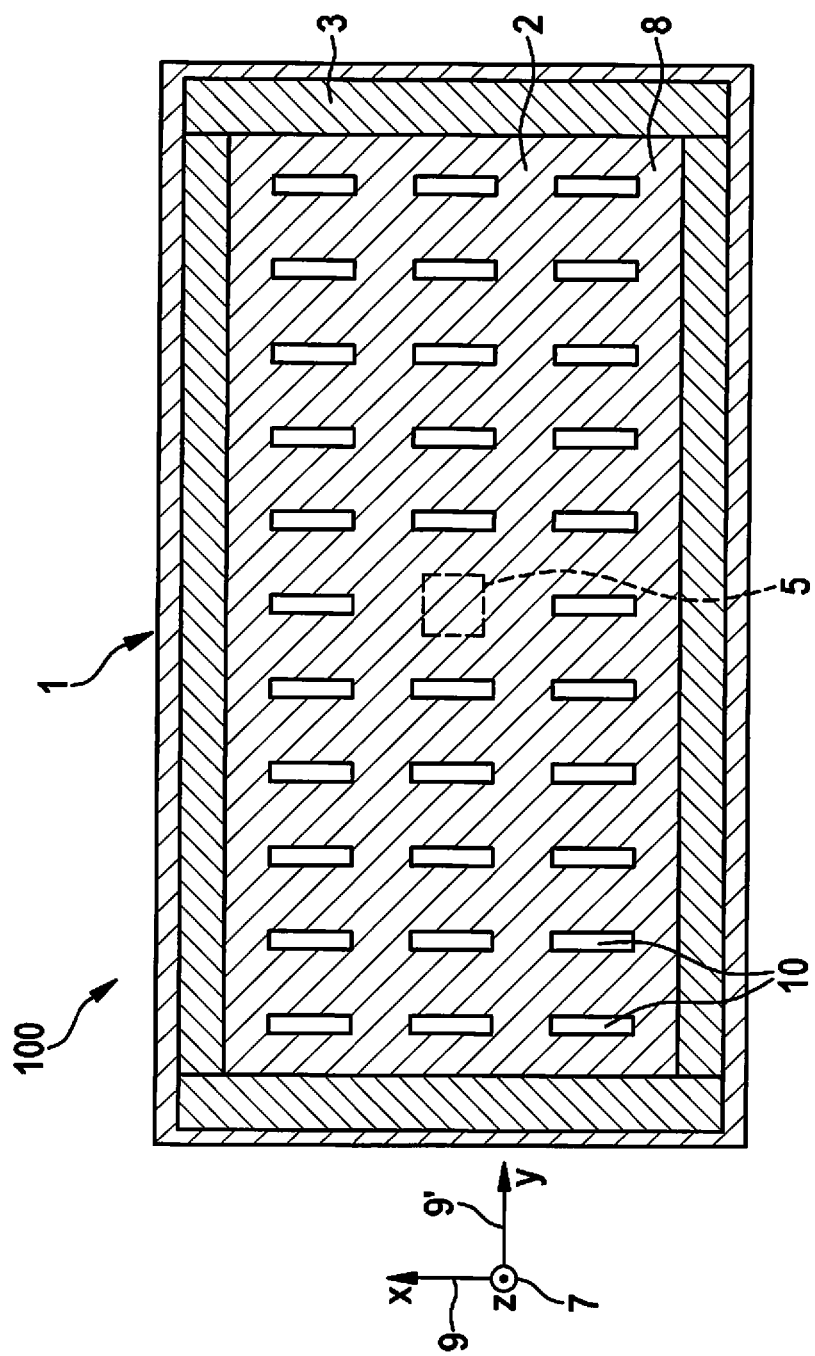
FIG. 3 shows a top view onto a portion of a micromechanical sensor system according to one specific embodiment of the present invention.

FIG. 3 shows in schematic form a top view onto a portion of a micromechanical sensor system according to one specific embodiment of the present invention.

FIG. 3 shows in detail a top view onto a structured thin layer 2, made of silicon, of a micromechanical sensor system 100. Also indicated is a stop 5, in the middle of thin layer 2, that protrudes into the plane of the drawing in FIG. 3. Thin layer 2 is rectangularly bordered by a connection element 3. In addition, thin layer 2 in x direction 9 has a smaller extension than in y direction 9'. Furthermore, thin layer 2 in x direction 9 has three rows of rectangular recesses 10 that are used to adjust or set the overall rigidity of stop element 2, 5. Rectangular recesses 10 may be produced in a simple manner, while circular recesses in particular provide improved stress relief. The width of the recesses in y direction 9' may be, for example, between 500 nm and 8 µm, in particular between 2 µm and 5 µm.

Figure 4:
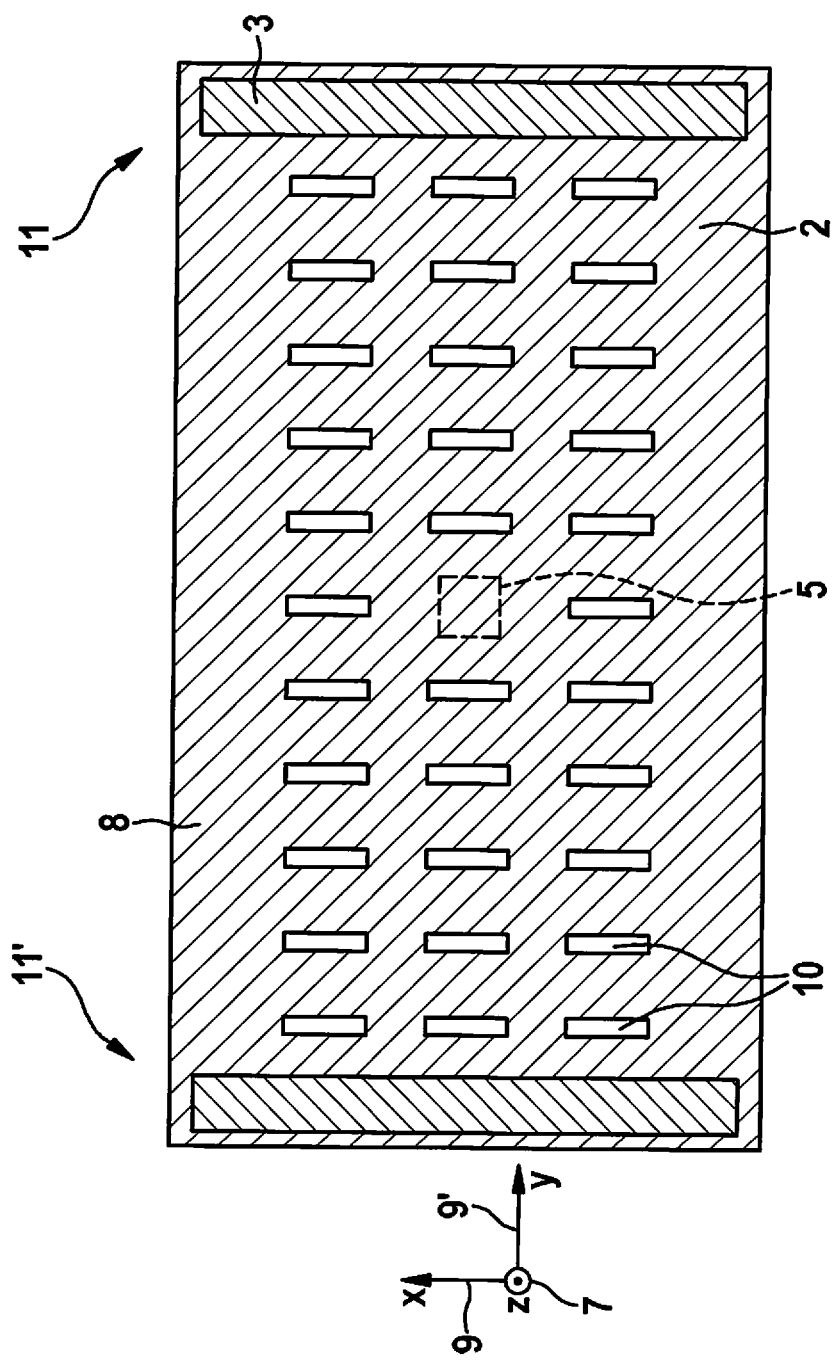
FIG. 4 shows a top view onto a portion of a micromechanical sensor system according to one specific embodiment of the present invention.

FIG. 4 shows in schematic form a top view onto a portion of a micromechanical sensor system according to one specific embodiment of the present invention.

FIG. 4 essentially shows a thin layer 2 and a connection element 3 according to FIG. 3. In contrast to connection element 3 according to FIG. 3, connection element 3 according to FIG. 4 is now situated only on narrow sides 11, 11' of thin layer 2, and has a rectangular design. The rigidity of stop element 2, 5 may likewise be adjusted in this way. In another modification of connection element 3, not shown here, the connection element extends only in y direction 9', at both the top and the bottom, across a portion of overall layer 2, resulting in a U-shaped connection element 3 to the left and right on narrow sides 11, 11' of thin layer 2. The transitions of connection element 3 are advantageously rounded at the corners of the U shape, which reduces the stress in connection element 3.

Figure 5:
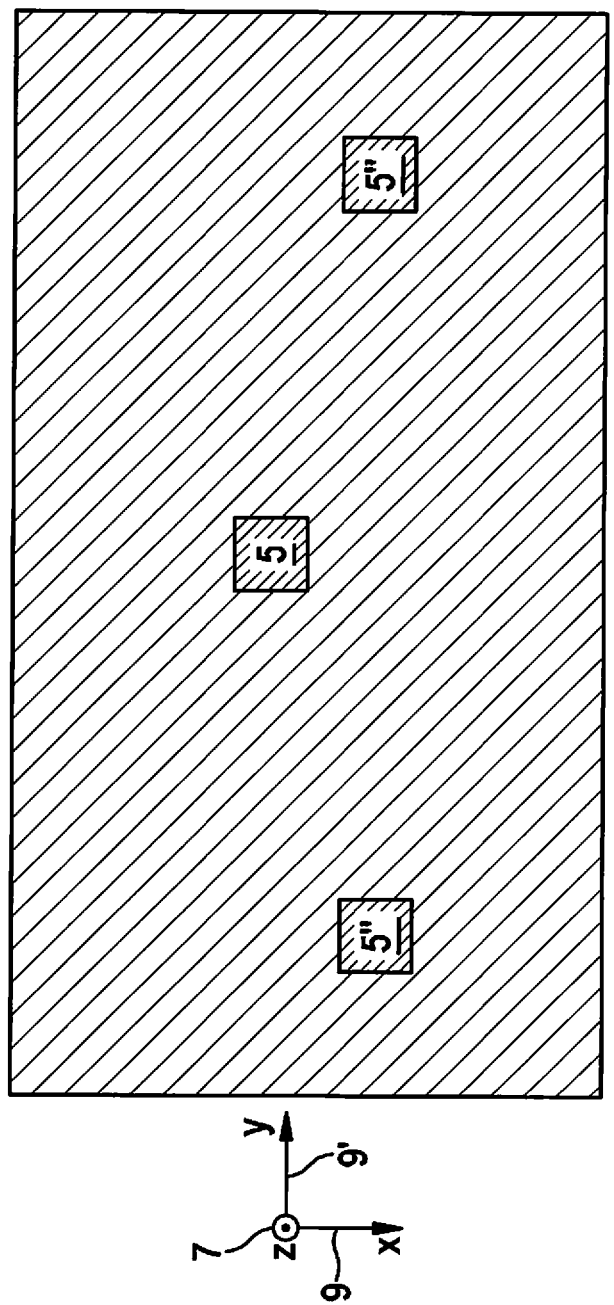
FIG. 5 shows a view from below onto a thin layer of a micromechanical sensor system according to one specific embodiment of the present invention.

FIG. 5 shows in schematic form a view from below onto a thin layer of a micromechanical sensor system according to one specific embodiment of the present invention.

FIG. 5 shows a thin layer 2 made of silicon in a view from below. Thin layer 2 has no structuring 10. Three stops 5, 5" are also shown, stop 5 being situated essentially in the middle of thin layer 2 and being offset with respect to the two other stops 5" in x direction 9. In y direction 9', stop 5 is situated essentially in the middle of the two stops 5".

When thin layer 2 without structuring is now rotated along its bottom longitudinal side about y axis 9', top stop 5 initially comes into contact with a substrate, and upon further overloading the two other stops 5" then simultaneously come into contact with the substrate. Thus, stops 5, 5" are, or form, a cascaded stop element 5, 5". In other words, an elastic stop cascade is provided. This is made possible by the symmetrical arrangement of stops 5, 5" in y direction 9' and their asymmetrical arrangement along x direction 9.

In another specific embodiment, one of the two stops 5" may be removed, resulting in an overall asymmetrical arrangement of stops 5, 5". In this way, a tilting motion may be exerted on a seismic mass 4 connected thereto, which as a whole further reduces sticking or adhesion of stops 5, 5".

The force ratio between stops 5, 5" may be set via the particular angle of stops 5, 5" relative to one another or relative to the deflection direction. The larger the angle that is selected, the greater the forces on the middle stop 5, and the lower the forces on the two lateral stops 5" in x direction 9.

To manufacture the micromechanical sensor system, the layers may be produced in succession in an additive process. Thus, for example, silicon may be initially deposited, structured, and then provided with a deposited and structured sacrificial layer, for example an oxide. Material is subsequently once again deposited, structured, and provided with an oxide layer. In a further step the oxide layers are removed from the spaces in between by gas phase etching, and the sensor system is thus exposed.

In summary, the present invention has the advantage, among other things, that adhesion to stop structures as well as damage to the micromechanical sensor system may be avoided. In addition, a defined distribution of striking forces may be made possible. High rotational rigidity of the stop element in a sensor plane may likewise be provided. As the result of a flexible structuring of the thin layer, in particular in the form of a thin plate and clamping of same, i.e., the design of the connection element, the rigidity of the stop element perpendicular to a sensor plane may be adjusted as a function of the surface area and thickness of the thin layer, and in particular high rigidities may be achieved in this way.

Although the present invention has been described with reference to preferred exemplary embodiments, it is not limited thereto, and is modifiable in numerous ways.

What is claimed is:

1. A sensor system, comprising:
   a mass that is deflectable at least in the z direction;
   a connection element that is joined to a thin layer; and
   multiple stop structures that are at least partially elastic and situated on a side of the thin layer facing away from the mass and oriented in the z direction,
   wherein a recess is situated between the mass and the thin layer,
   wherein the multiple stop structures have, at least in the z direction, different rigidities.

2. The sensor system as recited in claim 1, wherein the connection element is in the form of a connecting layer.

3. The sensor system as recited in claim 1, wherein the stop element includes a thin layer made of silicon.

4. The sensor system as recited in claim 3, wherein the thin layer includes: at least one recess and/or at least one hole and/or at least one elevation relative to a portion of the thin layer.

5. The sensor system as recited in claim 4, wherein at least two recesses included in the thin layer and/or at least two holes included in the thin layer are arranged in a periodic and/or symmetrical manner.

6. The sensor system as recited in claim 1, wherein the multiple stop structures in at least one direction along the thin layer have an increasing extension in the z direction.

7. The sensor system as recited claim 1, wherein the multiple stop structures having a high rigidity are situated in areas of the thin layer that are joined to the connection element.

8. The sensor system as recited in claim 1, wherein the multiple stop structures are asymmetrically situated on a thin layer.

9. The sensor system as recited in claim 1, wherein the connection element is U-shaped and is situated on two opposite sides of the thin layer, respective corners being rounded.

10. The sensor system as recited in claim 1, wherein the mass is a seismic mass of a spring-mass system.

* * * * *